United States Patent
Le et al.

(10) Patent No.: US 6,728,115 B1
(45) Date of Patent: Apr. 27, 2004

(54) EMI/RFI SHIELD FOR ADJACENT DEVICES

(75) Inventors: Bao G. Le, Orange, CA (US); Derek T. Nguyen, San Clemente, CA (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 10/126,115

(22) Filed: Apr. 19, 2002

(51) Int. Cl.$^7$ .................................................. H05K 7/00
(52) U.S. Cl. ...................... 361/816; 361/818; 361/800; 174/51; 174/35 R
(58) Field of Search ................................. 361/816, 818, 361/800, 752, 730, 724, 714, 797, 796, 825, 683, 685, 686; 174/51, 35 R; 257/99

(56) References Cited

U.S. PATENT DOCUMENTS

| | | | |
|---|---|---|---|
| 4,673,166 A | * | 6/1987 | MacDougall ................ 256/11 |
| 6,046,652 A | | 4/2000 | Deiso, III et al. ............. 333/12 |
| 6,147,299 A | | 11/2000 | Ferguson ...................... 174/35 |
| 6,188,015 B1 | | 2/2001 | Curran, Sr. et al. ........... 174/35 |
| 6,271,465 B1 | | 8/2001 | Lacey ........................... 174/35 |
| 6,272,022 B1 | | 8/2001 | Ferranti et al. ............. 361/818 |
| 6,377,449 B1 | * | 4/2002 | Liao et al. |

* cited by examiner

Primary Examiner—David Martin
Assistant Examiner—Hung Bui
(74) Attorney, Agent, or Firm—Scott Charles Richardson; Jeff Proehl; Leonard Proehl

(57) ABSTRACT

A string with conductive filaments is placed across an opening of an electronic cage at a point between two devices to be installed in the electronic cage. A cage for a personal computer is positioned within the personal computer and the string is positioned at a point to fill a gap between two drives when installed in the cage. The string comprises a twisted metal wire with multiple conductive filaments woven into the wire. The filaments are of sufficient length to contact both drives.

36 Claims, 3 Drawing Sheets

EMI/RFI SHIELD FOR ADJACENT DEVICES

FIELD OF THE INVENTION

The present invention relates to EMI/RFI shielding, and in particular to an EMI/RFI shield for adjacent devices in a cage.

BACKGROUND OF THE INVENTION

In the electronics and computer industry today, cases which hold circuitry that create electromagnetic radiation are shielded to prevent emission of radiation referred to as EMI/RFI. Regulatory bodies set maximum emission levels at various frequencies. Devices failing emission level tests may not be sold. Electronic devices may also need to be shielded from electromagnetic radiation generated by devices outside their cases. In the personal computer (PC) industry, processor speeds are increasing. Electronic devices, such as PCs must meet strict guidelines in the United States and other countries on the amount of radiation they produce within a given radius. With such high processor speeds, it is getting more and more difficult to ensure that PCs meet the radiation emission guidelines. In addition to the increasing frequency of operation, electronic devices must be manufactured in a cost effective manner to remain profitable.

Personal computers are frequently upgraded in function by users which may require taking apart the computer, adding circuitry, and putting the computer back together. To make this easier for a user to do, most PCs have panels which can be removed, and devices such as disk drives, CD and DVD players inserted into a cage. In some PCs, multiple such devices are staked vertically adjacent to each other. Such devices typically have a gap between them that is a source of EMI/RFI leakage. A way of preventing such leakage, while still permitting a user to upgrade their systems is needed.

Complex and costly solutions such as gluing an additional shield to cover gaps are too expensive, add additional parts which make the manufacturing process longer, are expensive, and prevent case of upgrading by a user. Applying a conductive foam strip with adhesive backing on either the bottom surface of the top device surface, or on the top surface of the bottom device is also difficult for users to perform.

SUMMARY OF THE INVENTION

A string with conductive filaments is placed across an opening of an electronic cage at a point between two devices to be installed in the electronic cage. In one embodiment, the cage is a drive cage for a personal computer. The cage is positioned within the personal computer and the string is positioned at a point to fill a gap between two drives when installed in the cage.

In a further embodiment, the string comprises a twisted metal wire with conductive filaments woven into the wire. The filaments are of sufficient length to contact both drives. The spacing of the filaments is varied as desired. In one embodiment, the spacing is dependent on the frequency of the radiation generated within the personal computer. The filaments are approximately perpendicular to the string in one embodiment. The filaments are randomly oriented with respect to the devices in one embodiment, and consistently oriented within a desired angle with respect to the devices in a further embodiment. In still further embodiments, each string has multiple wire brushes to ensure consistent contact with adjacent devices.

In one embodiment, the cage is provided with a flange having opposing cut out or stamped out hook portions on each side of the cage. The string is provided with a loop on each end for hooking over the hooks to position the string as desired. In one embodiment, the string is partially elastic such that it is stretchable for installation over the opposing hooks. In yet a further embodiment, a spring is provided proximate one of the hooks for coupling to the string, allowing easier installation for a non elastic string.

DETAILED DESCRIPTION OF THE INVENTION

In the following description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
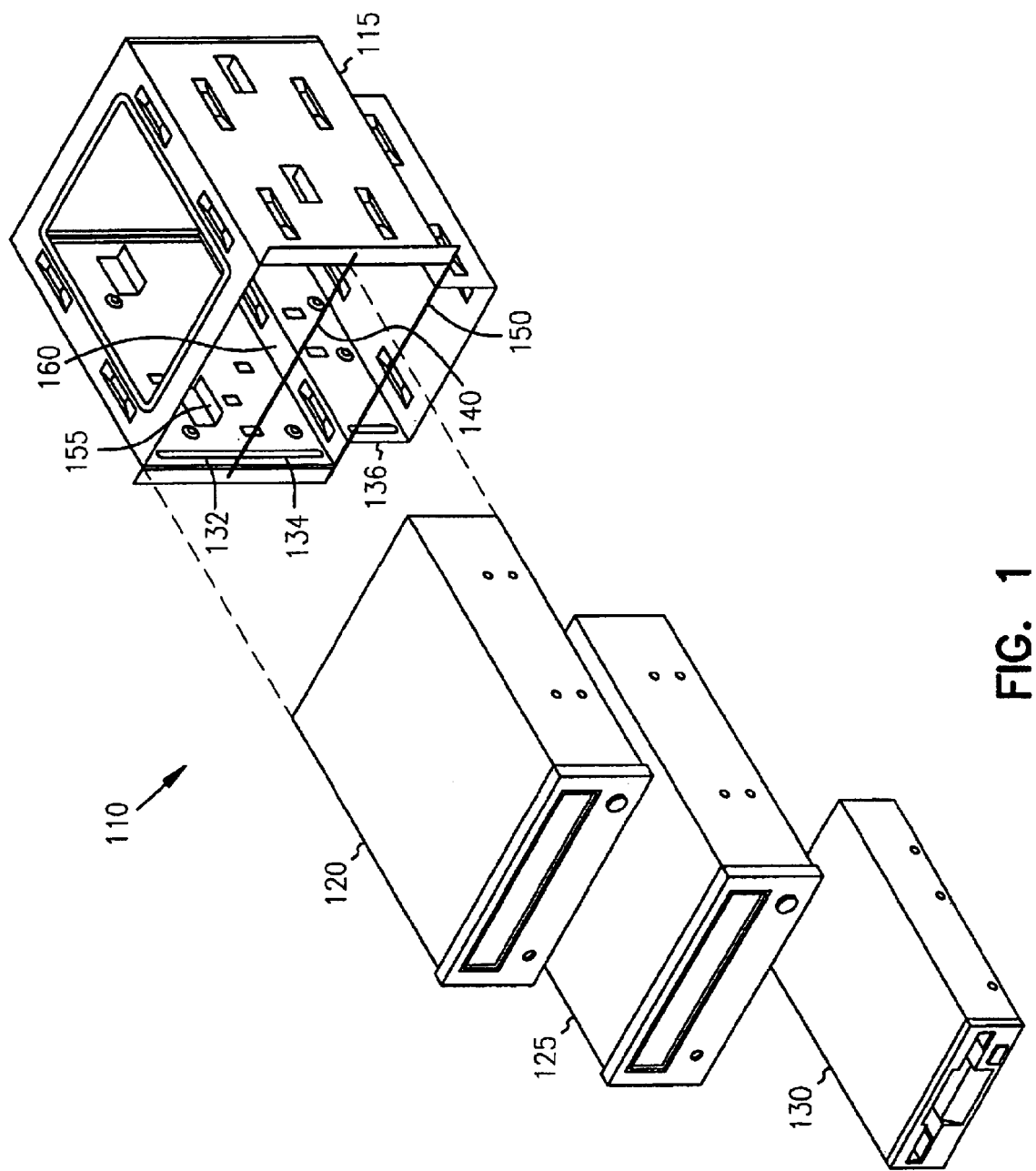
FIG. 1 is an exploded perspective view of a cage with components to be inserted.

A drive assembly is indicated generally at 110 in FIG. 1. The drive assembly comprises a cage 115 into which multiple drives 120, 125 and 130 are inserted and supported. The drive assembly is then installed into a frame of a computer device, such as a personal computer (PC). The drives are inserted into openings 132, 134 and 136 respectively. When inserted, there is an opening or aperture between adjacent drives through which EMI/RFI radiation leakage may occur. A string having conductive filaments or wire brushes is positioned between the openings at 140 and 150 such that the conductive filaments contact both adjacent drives. In one embodiment, the drives are installed prior to the string, and in other embodiments, the string is installed after the drives. Multiple brackets 155 are used to support drive 120, and a pair of shelves 160 are used to support drive 125. Drive 130 is supported by the floor of the cage 115.

In the embodiment shown the drives comprises CD, DVD, tape, PC card, diskette and other devices for a personal computer that are normally installed into a cage assembly. In other embodiments, other similarly modular devices are inserted into various cage like assemblies while utilizing such strings. Such modules are for larger computers, telephony switches, electronic instruments and any other type of modular electronic device generating radiation.

Figure 2:
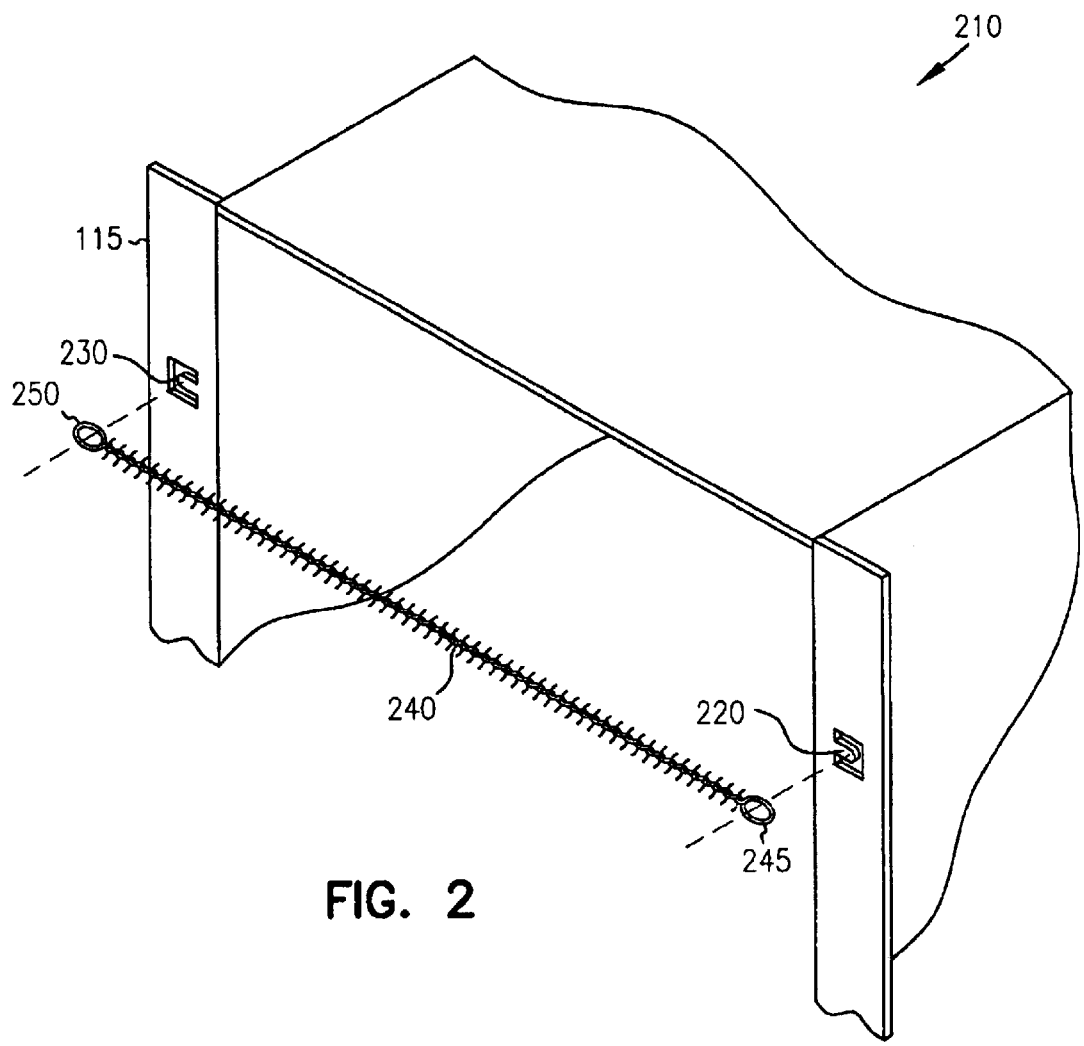
FIG. 2 is a perspective view of a portion of the cage of FIG. 1.

A closer view of the string is provided generally at 210 in FIG. 2, which shows a portion of cage 115. Cage 115 is provided with stamped out hook portions 220 and 230, which are located on opposite sides of the cage. The hook portions 220 and 230 are positioned such that installed adjacent drives contact the filaments of the string 240. String 240 has a loop 245 that couples to hook portion 220 and a loop 250 that couples to hook portion 230. Various other connection schemes such as knots in each end of the string, and mating v-shaped openings flanges of the cage are also within the scope of the invention.

String 240 comprises a two or more twisted conductive fibers such as copper or other conductive metal conducive to twisting. It looks similar to a test tube cleaning brush in one embodiment. String 240 in other embodiments is non-conductive, however, the filaments are conductive. The filaments are inserted between the fibers to be twisted in one embodiment, such that their orientation is transverse, or substantially perpendicular to the length of the twisted fiber. At least some of the filaments sufficiently follow a line drawn between two devices such that both ends of such filaments contacts a device. Other filaments may form an angle from such line in a random or repetitive fashion. In some embodiments, the string 240 is held in place by the loops, and a substantial number of the filaments are positioned substantially in line with the line drawn between the two devices. Such alignment is substantially perpendicular to each device, or at least aligned to contact both devices. The alignment is controlled during the twisting process in a known manner. The number of filaments required in such a string is less than when the filaments are randomly oriented.

Figure 3:
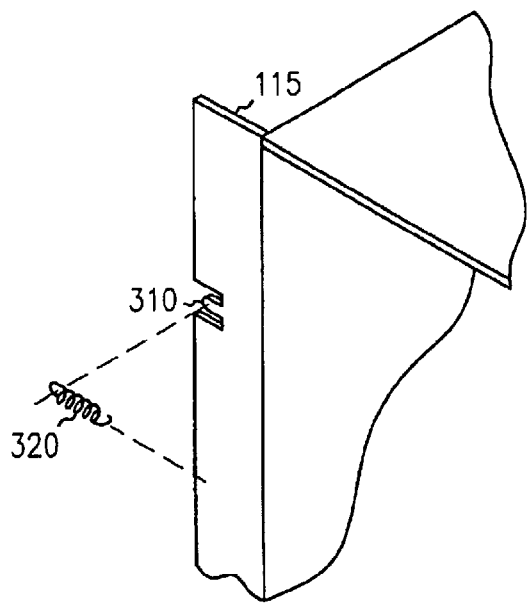
FIG. 3 is a perspective of an alternative portion of the cage of FIG. 1.

If FIG. 3, an alternative apparatus for connecting the string is shown. In this embodiment, cage 115 is provided with a cut out hook portion 310 that is cut out from the edge of the cage, as opposed to the middle of the flange portion as shown in FIG. 2. Many such other hook portions may be easily formed that can support string 240. A further alternative embodiment in FIG. 3 comprises the use of a spring 320 for coupling to hook portion 310 at one end of the spring having a mating hook. The other end of the spring has a hook for coupling to the string 240 which is not shown in FIG. 3.

Figure 4:
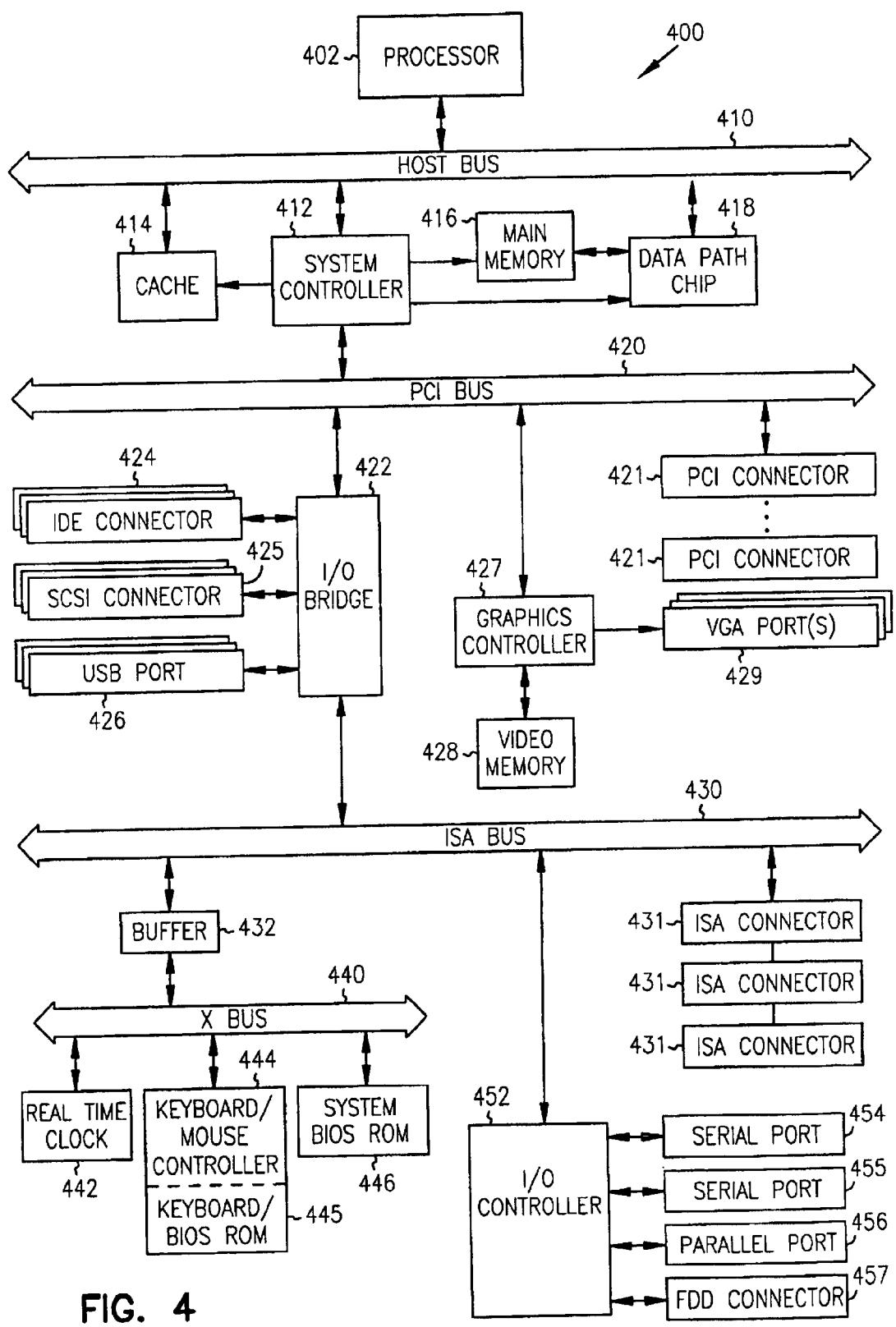
FIG. 4 is a detailed architectural block diagram of the computer system utilizing the current invention.

FIG. 4 is a block diagram of a computer system 400 that generates EMI/RFI radiation which must be blocked in accordance with regulations. Computer system 400 in one embodiment is a personal computer. Computer system 400 is housed in a sheet metal or other type of rigid radiation blocking material.

Computer system 400 comprises a processor 402, a system controller 412, a cache 414, and a data-path chip 418, each coupled to a host bus 410. Processor 402 is a microprocessor such as a 486-type chip, a Pentium®, Pentium® II, Pentium® III, Pentium®4, or other suitable microprocessor. Cache 414 provides high-speed local-memory data (in one embodiment, for example, 512 kB of data) for processor 402, and is controlled by system controller 412, which loads cache 414 with data that is expected to be used soon after the data is placed in cache 414 (i.e., in the near future). Main memory 416 is coupled between system controller 412 and data-path chip 418, and in one embodiment, provides random-access memory of between 16 MB and 256 MB or more of data. In one embodiment, main memory 416 is provided on SIMMs (Single In-line Memory Modules), while in another embodiment, main memory 416 is provided on DIMMs (Dual In-line Memory Modules), each of which plugs into suitable sockets provided on a motherboard holding many of the other components shown in FIG. 4. Main memory 416 includes standard DRAM (Dynamic Random-Access Memory), EDO (Extended Data Out) DRAM, SDRAM (Synchronous DRAM), or other suitable memory technology. System controller 412 controls PCI (Peripheral Component Interconnect) bus 420, a local bus for system 400 that provides a high-speed data path between processor 402 and various peripheral devices, such as graphics devices, storage drives, network cabling, etc. Data-path chip 418 is also controlled by system controller 412 to assist in routing data between main memory 416, host bus 410, and PCI bus 420.

In one embodiment, PCI bus 420 provides a 32-bit-wide data path that runs at 33 MHz. In another embodiment, PCI bus 420 provides a 64-bit-wide data path that runs at 33 MHz. In yet other embodiments, PCI bus 420 provides 32-bit-wide or 64-bit-wide data paths that run at higher speeds. In one embodiment, PCI bus 420 provides connectivity to I/O bridge 422, graphics controller 427, and one or more PCI connectors 421 (i.e., sockets into which a card edge may be inserted), each of which accepts a standard PCI card. In one embodiment, I/O bridge 422 and graphics controller 427 are each integrated on the motherboard along with system controller 412, in order to avoid a board-connector-board signal-crossing interface and thus provide better speed and reliability. In the embodiment shown, graphics controller 427 is coupled to a video memory 428 (that includes memory such as DRAM, EDO DRAM, SDRAM, or VRAM (Video Random-Access Memory)), and drives VGA (Video Graphics Adaptor) port 429. VGA port 429 can connect to industry-standard monitors such as VGA-type, SVGA (Super VGA)-type, XGA-type (eXtended Graphics Adaptor) or SXGA-type (Super XGA) display devices.

In one embodiment, graphics controller 127 provides for sampling video signals in order to provide digital values for pixels. Autophase correction is provided by monitoring synchronization pulses and polarities, and looking up new phase corrections 5 corresponding to the changes. In further embodiments, the video signal is provided via a VGA port 129 to an analog LCD display. The LCD display performs the monitoring, sampling and autophase adjustment as further described with respect to FIGS. 2 and 3.

Other input/output (I/O) cards having a PCI interface can be plugged into PCI connectors 421. Network connections providing video input are also represented by PCI 10 connectors 421, and include Ethernet devices and cable modems for coupling to a high speed Ethernet network or cable network which is further coupled to the Internet.

In one embodiment, I/O bridge 422 is a chip that provides connection and control to one or more independent IDE or SCSI connectors 424–425, to a USB (Universal Serial Bus) port 426, and to ISA (Industry Standard Architecture) bus 430. In this embodiment, IDE connector 424 provides connectivity for up to two standard IDE-type devices such as hard disk drives, CDROM (Compact Disk-Read-Only Memory) drives, DVD (Digital Video Disk) drives, video-cassette recorders, or TBU (Tape-Backup Unit) devices. Such devices are either installed at manufacturing time, or may be installed by a user by removal of a panel. The devices are supported by cage like structure as shown in FIG. 1 at 115, which is insertable into the computer system, or may be directly supported by similar cage like supports built directly into the computer housing.

In one similar embodiment, two IDE connectors 424 are provided, and each provide the EIDE (Enhanced IDE) architecture. In the embodiment shown, SCSI (Small Computer System Interface) connector 425 provides connectivity for up to seven or fifteen SCSI-type devices (depending on the version of SCSI supported by the embodiment). In one embodiment, I/O bridge 422 provides ISA bus 430 having one or more ISA connectors 431 (in one embodiment, three connectors are provided). In one embodiment, ISA bus 430 is coupled to I/O controller 452, which in turn provides connections to two serial ports 454 and 455, parallel port 456, and FDD (Floppy-Disk Drive) connector 457. At least one serial port is coupled to a modem for connection to a telephone system providing Internet access through an Internet service provider. In one embodiment, ISA bus 430 is connected to buffer 432, which is connected to X bus 440, which provides connections to real-time clock 442, keyboard/mouse controller 444 and keyboard BIOS ROM (Basic Input/Output System Read-Only Memory) 445, and to system BIOS ROM 446.

Installation of devices into computer 400 involves using a string of conductive fibers such as 140 either prior to or after insertion of a device into a bay of the cage. The loop at a first end of the string is put over one hook on one side of the computer. The loop at the other end of the string is pulled over the hook on the other side of the computer. Either the string is slightly elastic, allowing a slight stretching or a spring is used in conjunction with the string as described above. In yet further embodiments, the hooks may be moved closer together temporarily for installation of the string.

In one embodiment, the string, and conductive filaments block emissions of EMI/RFI in accordance with regulations. The string provides an easy way to both manufacture modular electronic devices, and also to upgrade them in the field by a user. The user is provided with a kit in one embodiment, including instructions, the multi-filament string, and a device to install. The string interferes very little with installation of the drive, as the filaments are flexible. The string biases the filaments against both adjacent drives when installed to provide multiple conductive paths between the drives along the length-of the string.

What is claimed is:

1. A system comprising:
a cage having supports;
two devices supported adjacent to each other in the cage; and
a string having transverse conductive filaments supported between the two devices;
wherein the devices are electronic devices.

2. The system of claim 1 wherein the string comprises a pair of wires twisted together.

3. The system of claim 1 wherein the devices are selected from the group consisting of CD drives, diskette drives, DVD drives, tape drives, disk drives and PC cards.

4. The system of claim 1 wherein the cage supports comprise tabs.

5. The system of claim 1 wherein the cage supports comprise a floor of the cage.

6. The system of claim 1 wherein the cage supports three adjacent devices and comprises a string between each device.

7. The system of claim 1 wherein the string comprises a loop on each end, and the cage comprises hooks.

8. The system of claim 7 wherein the cage is formed of sheet metal and the hooks are stamped out of flanges of the cage.

9. The system of claim 8 wherein the hooks are proximate an opening between two adjacent devices.

10. The system of claim 1 and further comprising a spring coupled to the string.

11. The system of claim 1 wherein at least a portion of the string is elastic.

12. The system of claim 1 wherein the cage supports the string.

13. The system of claim 1 wherein the devices comprise drives.

14. The system of claim 1 wherein the conductive filaments are oriented substantially perpendicular to an outer surface of the devices.

15. The system of claim 1 wherein at least a portion of the conductive filaments of the string contact both of the devices.

16. The system of claim 1 wherein the system comprises an electronic system.

17. An electronic system comprising:
electronic devices;
means for supporting the electronic devices adjacent to each other; and
means for providing conduction between the electronic devices to reduce radiation emission;
wherein the means for providing conduction comprises multiple conductive filaments transversely coupled to a string, the string being positioned in between the devices and extending across a gap between the devices such that at least some of the multiple conductive filaments contact both of the electronic devices.

18. A computer system comprising:
a cage having an opening and supports;
multiple storage devices drives supported adjacent to each other in the cage by the supports; and
a conductive brush supported between each pair of adjacent devices.

19. The system of claim 18 wherein the brush comprises a pair of wires twisted together.

20. The system of claim 18 wherein the devices are selected from the group consisting of CD drives, diskette drives, DVD drives, tape drives, disk drives and PC cards.

21. The system of claim 18 wherein the brush extends a distance approximately the length of the opening.

22. The system of claim 18 wherein the conductive brush comprises radiating conductive filaments.

23. A system comprising:
means for supporting devices; and
means for providing conduction between the devices to reduce radiation emission;
wherein the means for providing conduction is positioned in and extends across a gap between the devices.

24. The system of claim 23 wherein the means for providing conduction comprises multiple conductive filaments transversely coupled to a string.

25. The system of claim 25 wherein the multiple conductive filaments are coupled to the string in a substantially transverse orientation to a length of the string.

26. The system of claim 23 wherein the means for supporting devices comprises a metal cage having tabs that support the devices.

27. The system of claim 23 wherein the system is a personal computer, and wherein the devices are selected from the group consisting of CD drives, diskette drives, DVD drives, tapes drives, disk drives and PC cards.

28. The system of claim 23 wherein the means for supporting devices supports the means for providing conduction.

29. The system of claim 23 wherein the system is a computer.

30. The system of claim 23 wherein the devices comprise electronic devices.

31. The system of claim 30 wherein the means for conduction positioned in the gap contacts surfaces of the adjacent electronic devices in a substantially uniform manner along a length of the gap.

32. A method of reducing radiation from an electronic system having multiple installable devices adjacently supportable by a cage within the electronic system, the method comprising:

installing a string having transverse conductive filaments supported between adjacent devices; and installing the adjacent devices.

33. The method of claim 32 wherein the devices are installed prior to the string.

34. The system of claim 32 and additionally comprising supporting the string between the adjacent devices on supports formed on the cage.

35. An electronic system comprising:

a cage having supports;

two electronic devices supported adjacent to each other in the cage; and a string having transverse conductive filaments supported between the two electronic devices.

36. The system of claim 35 wherein the devices each generate radiation when in operation.

* * * * *